United States Patent [19]

Mitome

[11] Patent Number: 5,677,984
[45] Date of Patent: Oct. 14, 1997

[54] COMPLEX CEPSTRUM ANALYZER FOR SPEECH SIGNALS

[75] Inventor: Yukio Mitome, Tokyo, Japan

[73] Assignee: NEC Corporation, Tokyo, Japan

[21] Appl. No.: 392,482

[22] Filed: Feb. 23, 1995

[30] Foreign Application Priority Data

Feb. 23, 1994 [JP] Japan .................................. 6-024594

[51] Int. Cl.$^6$ .................................................. G10L 7/06
[52] U.S. Cl. ................................... 395/2.12; 395/2.4
[58] Field of Search ............................. 395/2.12, 2.13, 395/2.14, 2.2, 2.4; 381/29, 30, 37, 40

[56] References Cited

U.S. PATENT DOCUMENTS 3,662,108  5/1972  Flanagan ........................ 179/1 SA
4,374,304  2/1983  Flanagan ..................... 179/15.55 R

OTHER PUBLICATIONS

Bednar et al., "Calculating the Complex Cepstrum Without Phase Unwrapping or Integration," ASSP-33 No. 4, pp. 1014–1017, Aug. 1985.

Primary Examiner—Allen R. MacDonald
Assistant Examiner—Robert Mattson
Attorney, Agent, or Firm—Foley & Lardner

[57] ABSTRACT

Respective samples of input speech data are transformed by a discrete Fourier transformer to obtain a spectrum of the speech data. Simultaneously, values of times of the respective samples are multiplied with the input speech data by a multiplier and a differential spectrum is obtained by transforming a result of the multiplication by a discrete Fourier transformer. A real part of a value obtained by dividing the differential spectrum by the spectrum by a quotient real part calculator and the real part is inverse-transformed by a discrete inverse Fourier transformer. The result of the inverse-transformation is divided by the values of the times of the respective samples to obtain a time function corresponding to phase. On the other hand, a time function corresponding to a logarithmic amplitude spectrum is obtained from an output of the inverse-Fourier transformer by means of a logarithmic amplitude spectrum calculator. A complex cepstrum is obtained by adding the both time functions at respective times by an adder.

3 Claims, 2 Drawing Sheets

COMPLEX CEPSTRUM ANALYZER FOR SPEECH SIGNALS

BACKGROUND OF THE INVENTION

The present invention relates to a complex cepstrum analyzer for speech signals and, particularly, to a device for extracting, from a digitized speech signal, a complex cepstrum which is a parameter indicating an amplitude spectrum and a phase characteristics of the digitized speech signal.

The cepstral analysis is well known as a technology for use in, for example, a speech recognition device to extract with high precision a parameter indicating an envelope of a spectrum of an input speech signal. Cepstrum is a physical quantity obtained by inverse-Fourier transformation of a logarithmic amplitude spectrum of an input speech signal in a manner to be mentioned below:

First, the input speech signal is digitized and speech data $x(n)$ is obtained by multiplying it with a window for short time analysis. Width of this window is set to 10 msec to several tens msec. Then, a digital Fourier transform $X(\omega)$ of the voice data $x(n)$ for analysis is obtained by the following equation (1):

$$X(\omega) = \Sigma x(n) \exp(-i\omega n) \quad (1)$$

where n is a time instance, i is an imaginary unit number and $\omega$ is an angular frequency. In the following description, the equation (1) will be represented by the following equation (2) for simplicity.

$$X(\omega) = F(x(n)) \quad (2)$$

Logarithmic amplitude spectrum $Y(\omega)$ is defined by the following equation (3):

$$Y(\omega) = \log(|X(\omega)|) = \log(|F(\omega)|) \quad (3)$$

where || represents an absolute value.

Cepstrum $y(n)$ of the speech data $x(n)$ for analysis is defined by the quantities indicated above by the following equation (4):

$$\begin{aligned} y(n) &= FI[Y(\omega)] \\ &= FI[\log(|X(\omega)|)] \\ &= FI[\log(|F(x(n))|)] \end{aligned} \quad (4)$$

where FI[] represents an inverse Fourier transform (DIFT). Although n of cepstrum $y(n)$ is generally called as quefrency, it will be called in this description as time instance or time. Further, although a high speed algorithm called fast Fourier transform (FFT) has been known for Fourier transform of a digital signal, that is, digital Fourier transform (DFT), the term DFT used in this description should be interpreted as also including FFT.

In obtaining a spectrum envelope parameter from cepstrum $y(n)$, a component $y'(n)$ having period not longer than about a pitch period of the input voice signal is derived from the cepstrum and a parameter indicating a spectral envelope of the input speech signal is extracted by Fourier transform of $y'(n)$ and supplied to a voice recognition device, etc.

Since, in this cepstrum analysis, however, a phase information is discarded although the spectral envelope can be extracted precisely, it is not suitable for a more precise analysis of the input speech signal. On the other hand, complex cepstrum analysis which is developed from the cepstrum analysis is characterized by that it can extract not only spectral envelope but also phase.

Complex cepstrum $C(n)$ is defined as an inverse Fourier transform of a complex logarithm of spectrum $X(\omega)$ as represented by the following equation (5), where complex logarithm includes a real part indicating a logarithm of an absolute value of the spectrum and an imaginary part of a phase as a continuous function of frequency:

$$C(n) = FI[\log(X(\omega))] \quad (5)$$

The equation (5) can be represented by the following equation (7) when complex logarithm of spectrum is represented by the following equation (6):

$$C(\omega) = \log(X(\omega)) \quad (6)$$

$$c(n) = FI[C(\omega)] \quad (7)$$

Although logarithmic function of the equation (3) is a function of real number and logarithmic function of the equation (6) is a function of complex logarithm, the definition of the equation (3) is also correct as complex logarithm since it takes the absolute value of spectrum and therefore the same notation will be used for both the equations (3) and (6).

In obtaining complex logarithm of spectrum in the course of realizing a speech analysis using complex cepstrum, there is a difficulty in obtaining an imaginary part thereof although a real part thereof is easily obtained. The difficulty will be described.

That is, although phase is usually obtained as an argument between a real part and an imaginary part of spectrum, it does not become a continuous function of frequency. This is because, when phase exceeds $\pi$ to $\pi+\alpha$, the argument is monitored as $-\pi+\alpha$ and thus it becomes a function discontinuous at phase $\pi$.

The following three methods have been known by either of which this problem can be solved:

(1) Phase unwrapping method
(2) Method based on a relation between differentiation of spectrum and Fourier transformation
(3) Method based on factorization.

The phase unwrapping method (1) is disclosed in, for example, the following article 1:

Article 1: A. V. Oppenheim and R. W. Schafer, "Digital Signal Processing", Chapter 10, 1975.

In this method (1), spectrum is approximated by a function of discrete frequency and is obtained by using DFT similarly to the above-mentioned usual cepstrum. For a complex logarithmic function of the spectrum, a real part is obtained as a logarithm of an absolute value of the complex and phase which is an imaginary part thereof is obtained by obtaining first a principal value having an argument contained in a range from $-\pi$ to $\pi$ and processing it by adding an integer multiple of $2\pi$ while judging a continuity of phase. In order to perform the judgement of continuity, a large number of DFT points are used to make distance between adjacent discrete frequencies small. After values of argument at adjacent frequency samplings changes from about $\pi$ to about $-\pi$, an integer multiple of $2\pi$ is added to the argument. The integer depends upon whether or not such change is detected every time. On the other hand, when the argument is changed from $-\pi$ to $\pi$, the integer is reduced by 1.

In the method (2) based on the relation between differentiation of spectrum and Fourier transform is also disclosed in the article 1 mentioned previously.

The following equation (8) is obtained by differentiating frequency in the equation (1):

$$X'(\omega) = \Sigma\{-in \cdot x(n) \cdot \exp(-i\omega n)\} \quad (8)$$
$$= F[-in \cdot x(n)]$$

Therefore, the following relations are established. These relations are established for not only spectrum but also all which are in Fourier transform relation.

$$iX'(\omega)=F[n \cdot x(n)] \quad (9)$$

$$x(n)=FI[ix'(\omega)]/n \quad (10)$$

On the other hand, the following equation is obtained by differentiating $C(\omega)$ of the equation (6):

$$C'(\omega)=X'(\omega)/X(\omega) \quad (11)$$

In the equation (10), the following equation is established for a case of complex cepstrum:

$$c(n)=FI[iC'(\omega)]/n \quad (12)$$

By inserting the equation (11) to the equation (12) and considering the relation between the equations (9) and (2), the complex cepstrum can be represented by the following equation (13):

$$c(n) = FI[iX'(\omega)/X(\omega)]/n \quad (13)$$
$$= FI[F[n \cdot x(n)]/F[x(n)]]/n$$

The equation (13) shows that complex cepstrum other than n=0 is obtained by dividing Fourier transform of n·x(n) by Fourier transform of x(n), performing an inverse Fourier transform of a result therefrom and dividing a result from the inverse Fourier transform by n. Although complex cepstrum when n=0 must be obtained separately, it is equal to a usual cepstrum when n=0. Also in this method, a calculation for the Fourier transform is performed by using the DFT.

The following article 2 discloses an improvement of the method (2):

Article 2: J. Toribolet, "A New Phase Unwrapping Algorithm", IEEE Transactions, ASSP-25, pp. 170–179, April 1977.

In this method, the right term of the equation (11) is obtained by using the equation (8) and $C(\omega)$ is obtained by numerical integration of the right term thus obtained. In this case, Fourier transformation is also performed by using the DFT. Since, in this example, the object is to obtain phase, only a portion of $C(\omega)$, which relates to phase, is numerical-integrated.

The conventional method (3) based on factorization is disclosed in the following article 3:

Article 3: K. Steiglitz and B. Dickinson, "Phase Unwrapping by Factorization", IEEE Transactions, ASSP-30, pp. 984–991, December 1982.

In this method, a function representing a signal spectrum is factorized and complex cepstrum is obtained from roots of it. For factorization, roots of polynominal equations are obtained by numerical solution. If the spectrum function is factorized, logarithm of the spectrum is represented by a sum of logarithms of respective factors, according to the nature of logarithmic function. Therefore, if complex cepstra of the respective terms are obtained, the whole complex cepstrum is obtained as a sum of these complex cepstra. The article 1 mentioned previously described that the complex cepstrum can be easily obtained theoretically since the respective terms are linear functions.

The conventional complex ceptral analyzer mentioned above can extract complex cepstrum which is a parameter indicating magnitude spectrum and phase characteristics of a signal. However, there are following problems occurred when it is used for a speech signal.

In the conventional phase unwrapping method (1) in which a spectrum is sampled at discrete values of a frequency which is a continuous variable and it is determined whether or not function values of adjacent samples are continuous. The determination of continuity of adjacent sample values is considerably difficult and determination error may occur frequently. If a multiple of $2\pi$ to be added is not added or unnecessary value is added due to the determination error, it is impossible to estimate a correct phase characteristics. If a phase characteristics be very smooth, such error may be avoided by making the frequency sampling period very fine. However, in a case of speech signal, particularly, voiced sound whose spectrum contains harmonic wave structure corresponding to pitch period thereof, not only amplitude spectrum but also phase characteristics change finely in the vicinity of each harmonic wave. Sometimes, the change of phase becomes nearly $\pi$. In such case, it is difficult to determine whether a multiple of $2\pi$ is to be added or to be subtracted, leading to an error of phase estimation.

In the conventional method (2) based on the relation between differentiation of spectrum and Fourier transform, there is the following problem. It is known that cepstrum, usual cepstrum or complex cepstrum, has an infinite length of duration theoretically. When cepstrum is computed by using the DFT, the cepstrum having infinite duration includes aliasing in time domain since angular frequency $\omega$ is sampled. This is analogous to a case where, when a signal which is not band limited in frequency domain is sampled in time domain, aliasing occurs in frequency domain which becomes a source of error. Although the problem of the aliasing in time domain is unavoidable in computing cepstrum by using the DFT, its influence can be minimized by sufficiently increasing the number of points of the DFT since it is known that the value of cepstrum reduces proportionally to an inverse number of time.

However, since the inverse of differentiation of spectrum is performed before it becomes 1/n times as shown by the equation (13), aliasing may occur in this stage. Particularly, differentiation of voiced speech spectrum which contains high harmonic wave structure corresponding to pitch as mentioned previously is monitored as a pulse train of each pitch frequency in frequency domain. The inverse of it is a pulse train of each pitch period in time domain, which is monitored as being emphasized compared with usual cepstrum and is unavoidably influenced by turn-back. According to an experiment in which a data obtained by sampling a practical audio signal at 10 kHz and multiplying it with a window of 20 to 30 msec, that is, a data containing 200 to 300 samples was analyzed, it was confirmed that an influence of turn back error is remarkably appeared on a spectral envelope extracted by using the fast Fourier transform of 8192 points.

According to the conventional method (3), there is no influence of determination error of continuity and aliasing error in time domain. However, the speech analysis is performed by using a data of from at least 100 points to several hundreds points when the sampling frequency is about 10 kHz and length of window is 10 to several tens msec. Therefore, the function of spectrum in this case becomes a polynominal equation having 100 to several hundred orders. It is practically impossible to factorize such polynominal equation for each frame because a considerably large amount of operation is required. Further, there is no guarantee that all factors can be obtained by the numerical solution.

As mentioned above, when these conventional technique is applied to a cepstral analysis of voiced speech, it is impossible to avoid the influence of the determination error and turn back error and/or it is impossible to implement it practically.

SUMMARY OF THE INVENTION

An object of the present invention is to provide a complex cepstral analyzer for speech signals which analyzes data obtained by digitizing a voice signal and extracts a complex cepstrum which is a parameter representing its logarithmic amplitude spectrum and phase characteristics with high precision with a relatively small amount of operation.

According to the present invention, there is provided a complex cepstral analyzer for analyzing a speech data and extracting a complex cepstrum. The analyzer includes a first discrete Fourier transformer for outputting a voice sound spectrum by performing a discrete Fourier transform for respective samples of an input speech data. The analyzer also includes a multiplier for multiplying the respective samples of the input speech data with values of time instances of the respective samples. The analyzer further includes a second discrete Fourier transformer for outputting a differential spectrum by performing a discrete Fourier transform for an output of the multiplier. The analyzer still further includes a logarithmic amplitude spectrum calculator for computing logarithm of an absolute value of the voice sound spectrum outputted from the first discrete Fourier transformer and outputting it as a logarithmic amplitude spectrum. The analyzer includes a first discrete inverse Fourier transformer for outputting a time function corresponding to the logarithmic amplitude spectrum by performing a discrete inverse Fourier transform of the logarithmic amplitude spectrum outputted from the logarithmic amplitude spectrum calculator. The analyzer also includes a quotient real part calculator for outputting a real part of a quotient obtained by dividing the differentiation spectrum supplied from the second discrete Fourier transformer by the voice sound spectrum supplied from the first discrete Fourier transformer. The analyzer further includes a second discrete inverse Fourier transformer for outputting a time function value corresponding to the real part of the quotient output from the quotient real part calculator by performing a discrete inverse Fourier transform for the real part of the quotient. The analyzer still further includes a divider for dividing the value of each of the samples of the time function corresponding to the real part of the quotient by a time value of the sample and outputting a result as a time function value corresponding to phase of the voice sound spectrum. The analyzer also includes an adder for adding the time value of the time function corresponding to phase of the voice sound spectrum outputted from the divider to the time value of the time function corresponding to the logarithmic amplitude spectrum output from the first distance inverse Fourier transformer and outputting a result as a value of each time of a complex cepstrum.

DETAILED DESCRIPTION OF THE PREFERRED EMBODIMENTS

Figure 1:
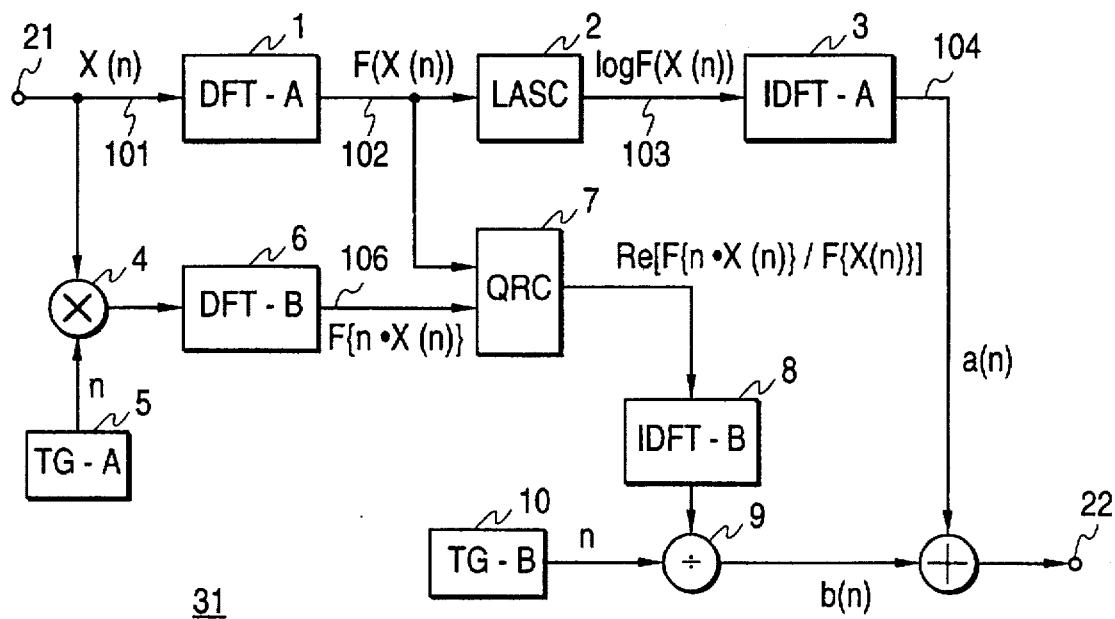
FIG. 1 is a block diagram of a first embodiment of the present invention.

Before describing the preferred embodiments of the present invention, the principle of the present invention will be described.

In the present invention, a component of a complex cepstrum corresponding to phase of a signal and a component thereof corresponding to logarithmic amplitude of the signal are obtained separately and the complex cepstrum is obtained from a sum of these components and the present invention differs from the conventional complex cepstral analysis in that a time function corresponding to phase of the signal is obtained by obtaining a real part of a quotient obtained by dividing a differential spectrum by a voiced sound spectrum, performing an inverse Fourier transform for the thus obtained real part and multiplying a sample of a result at each of time instance with a value of the time instance. In the present invention, the component corresponding to phase of the signal is obtained by using the relation between the differentiation of spectrum and Fourier transform as in the conventional method (2). However, the present invention differs from the conventional method (2) in which complex cepstrum is obtained by performing an inverse transform for the quotient obtained by dividing the differential spectrum by the voiced sound spectrum and multiplying a result with a value of time in that only the real part of the quotient obtained by dividing the differential spectrum by the voiced sound spectrum is inverse transformed and the component corresponding to phase is obtained by multiplying a result with the value of time.

This scheme of the present invention is based on a utilization of the nature of voiced speech that logarithmic spectrum and phase are different in influence of aliasing in time domain due to differentiation.

That is, as mentioned previously, the logarithmic amplitude spectrum of voice sound includes harmonic wave structure for every pitch frequency and, when the spectrum is differentiated, it is monitored as a very long, theoretically infinitely long pulse train in time domain. Therefore, the problem of influence of aliasing in time domain is unavoidable. On the contrary, variation of phase of the spectrum for every pitch frequency is relatively smooth compared with that of the logarithmic magnitude spectrum. Therefore, differentiation of it does not become in the form of such pulse as that of the differentiation of logarithmic amplitude spectrum and further the time function corresponding thereto is attenuated within a relatively short time. Thus, it is hardly influenced by aliasing.

The principle on which the component corresponding to phase is obtained from the real part of the quotient obtained by dividing the differential spectrum by the signal spectrum will be described. First, complex logarithm of a spectrum is represented by $$C(\omega) = \log(X(\omega)) \quad (14)$$
$$= A(\omega) + iB(\omega)$$

where the real part $A(\omega)$ is the logarithmic magnitude spectrum and the imaginary part $B(\omega)$ is phase. Representing inverse transforms of them by $a(n)$ and $b(n)$, respectively, complex cepstrum becomes as represented by the equation (17).

$$a(n) = FI[A(\omega)] \quad (15)$$

$$b(n) = FI[iB(\omega)] \quad (16)$$

$$c(n) = a(n) + b(n) \quad (17)$$

On the other hand, since, from the equation (13), the quotient obtained by dividing the differential spectrum by the voiced sound spectrum equals to a value obtained by differentiating the equation (14) and multiplying a result with the unit of imaginary number, the following equation is established:

$$iC(\omega) = F\{n \cdot x(n)\}/\{x(n)\} \quad (18)$$
$$= iA'(\omega) - B'(\omega)$$

From the equation (18), the following equation is obtained:

$$-B'(\omega) = Re[F\{n \cdot x(n)\}/F\{x(n)\}] \quad (19)$$

where Re[ ] means an operation in which a real part is used.

By applying the equation (16) to the relation shown by the equation (10), the following equation is obtained:

$$b(n) = FI[i(iB'(\omega)]/n \quad (20)$$
$$= FI[-B'(\omega)]/n$$
$$= FI[Re[F\{n \cdot x(n)\}/F\{x(n)\}]]/n$$

The equation (20) shows that a time function corresponding to phase of the signal is a quotient obtained by dividing a value of an inverse transform of a real part of a quotient at each time instance, which is obtained by dividing a differential spectrum by a voiced sound spectrum, by the time instance. In this case, the divisional operations must be performed by using complex numbers. However, since only the real parts of the results of divisions are required, the amount of operation when only the real parts are obtained becomes much smaller than a case where the real parts are derived after the divisional operations of complex numbers are completed.

The term "differential spectrum" used in this specification means a Fourier transform of a spectrum multiplied with time in time domain, specifically, a differentiation of a voiced sound spectrum multiplied with unit imaginary number.

In a third aspect of the present invention, instead of the addition of a component corresponding to phase to a logarithmic amplitude spectrum immediately after the component is obtained as in a first aspect of the present invention, the analysis is performed with high precision by converting the component into frequency domain to obtain a first order approximation of phase, comparing the first order approximation with an angle of deviation of the original spectrum, inverse-transforming phase whose value is corrected by a result of comparison again and adding the inverse transformed phase to the logarithmic amplitude spectrum. Since error due to aliasing is minor, the integer multiple of $2\pi$ can be obtained without error and without necessity of determination of continuity, by the comparison of the first order approximation of phase with the argument. The integer multiple of $2\pi$ is the difference between the first order approximation of phase and the argument rounded to the nearest whole number and an error in rounding the difference is the error due to turn back. It becomes possible to perform the complex cepstral analysis with higher precision by correcting the first order approximation of phase to a more precise phase and adding an inverse transform thereof and a component corresponding to the amplitude spectrum.

The embodiments of the present invention will be described with reference to the accompanying drawings.

As common matters for the embodiments to be described, a data which is obtained by digitizing a speech signal and multiplying the digitized speech signal with a window is used as an input signal, which data will be referred to as speech data. Therefore, in order to analyze a spectrum which varies with time, it is necessary to supply speech data picked up at different times to the analyzer according to the present invention time to time. In this specification, the present invention will be described to analyze 1 frame of speech data. As a window function, any of Hanning window, Hamming window and rectangular window, etc., may be used so long as it is suitable for the object. Although the number of points of discrete Fourier transform and length of window are generally different, the analysis is performed with speech data other than speech data multiplied with window being 0.

FIG. 1 is a block diagram showing a first embodiment of the present invention. A complex cepstral analyzer 31 for voice signals according to the first embodiment is constructed with an input terminal 21 for receiving samples of speech data multiplied with window, a discrete Fourier transformer (DFT-A) 1 connected to the input terminal 21 for performing discrete Fourier transform for the input samples of speech data and outputting a spectrum of voiced sound, a multiplier 4 connected to the input terminal 21 for multiplying the samples of the speech data with values of respective times generated by a time generator (TG-A) 5, a discrete Fourier transformer (DFT-B) 6 for performing a discrete Fourier transform for an output of the multiplier 4 and outputting a result as a differential spectrum, a logarithmic amplitude spectrum calculator (LASC) 2 for calculating a logarithm of an absolute value of the spectrum outputted from the discrete Fourier transformer (DFT-A) 1 and outputting a result as a logarithmic amplitude spectrum, a discrete inverse Fourier transformer (IDFT-A) 3 for performing a discrete inverse transform for the logarithmic amplitude spectrum output from the logarithmic amplitude spectrum calculator (LASC) 2 and outputting a result as a time function corresponding to the logarithmic amplitude spectrum, a quotient real part calculator (QRC) 7 for outputting a real part of a quotient obtained by dividing the differential spectrum input from the discrete Fourier transformer (DFT-B) 6 by the voice spectrum input from the discrete Fourier transformer (DFT-A) 1, an inverse discrete Fourier transformer (IDFT-B) 8 for performing an inverse discrete Fourier transformation for the real part of the quotient output from the quotient real part calculator and outputting a result as a time function corresponding to the real part of the quotient, a divider 9 for dividing a value of each sample of the time function corresponding to the real part of the quotient by a value of each time generated by a time generator (TG-B) 10 and outputting a result as a time function corresponding to phase of the voice spectrum and an adder 11 for adding time values of the time function corresponding to phase of the voice spectrum output from the divider 9 and the time function corresponding to the logarithmic amplitude spectrum and outputting a result to an output terminal 22 as a value of complex cepstrum at each time.

Now, an operation of the analyzer will be described.

First, the discrete Fourier transformer (DFT-A) 1 performs a discrete Fourier transform for a speech data x(n) inputted from the input terminal 21 through a signal line 101 to obtain a spectrum F(x(n)) of the speech data. The spectrum F(x(n)) is supplied to the logarithmic amplitude spectrum calculator (LASC) 2 and the divider 7 through a signal line 102. The speech data spectrum thus obtained contains values at discrete frequencies and is a complex numerical value. Logarithmic value, that is, [log|X(ω)|], of real part of an absolute value of the input speech data spectrum is obtained by the logarithmic amplitude spectrum calculator (LASC) 2 at each of discrete frequencies (ω) and supplied to the discrete inverse Fourier transformer (IDFT-A) 3 through a signal line 103. The inverse discrete Fourier transformer (IDFT-A) 3 operates to obtain an inverse Fourier transform, that is, a(n) in the equation (15), of the input logarithmic amplitude spectrum and supplies it to the adder 11 through a signal line 104.

On the other hand, the speech data x(n) input through the signal line 101 is also supplied to the multiplier 4 in which the voice data x(n) is multiplied with a value, that is, n, corresponding to time of each sample and a result is supplied to the discrete Fourier transformer (DFT-B) 6 through a signal line 105. In this case, the time generator (TG-A) 5 generates time value n in synchronism with the input signal and supplies it to the multiplier 4. Then, the discrete Fourier transformer (DFT-B) 6 outputs a Fourier transform Re[F{n·x(n)}] of the voice data multiplied with the time sent from the multiplier 4, n·x(n), which is supplied to the quotient real part calculator (QRC) 7. This data corresponds to the differential spectrum, in more particularly, the differential spectrum multiplied with unit of imaginary number, and, therefore, this data is also a complex data.

The quotient real part calculator (QRC) 7 operates to calculate a real part Re[F{n·x(n)}/F{x(n)}] of a value obtained by dividing the data F{n·x(n)} from the discrete Fourier transformer (DFT-B) 6 by the data supplied from the discrete Fourier transformer (DFT-A) 1 and supplies the result to the inverse discrete Fourier transformer (IDFT-B) 8. The inverse discrete Fourier Transformer (IDFT-B) 8 operates to obtain an inverse Fourier transform of the output of the quotient real part calculator (QRC) 7 and supplies the result to the divider 9 through a signal line 106.

The complex cepstrum is also significant at negative times. However, since, when the inverse discrete Fourier transform is used, a later part of the data points corresponds equivalently to negative time, the time generator (TG-B) 10 generates time data which acts to reduce a negative value in synchronism with a transfer of the later half of the data and sends the time data to the divider 9 through a signal line 112.

The divider 9 operates to divide the data sent from the inverse discrete Fourier transformer (IDFT-B) 8 by the equivalent time data sent from the time generator (TG-B) 10 and supplies a resultant value b(n) to the adder 11. In the adder 11, the data from the inverse discrete Fourier transformer (IDFT-A) 3 is added to the data from the divider 9 which corresponds in time to the data from the inverse discrete Fourier transformer and a resultant data is output to the output terminal 22 as a complex cepstrum data.

It is necessary for the discrete Fourier transformers (DFT-A) 1 and (DFT-B) 6 to temporarily store the data sent in sequence of sampling time in their internal buffers and then Fourier-transform them. In a case where the so-called fast Fourier transform is used, it is well known that a memory is enough to have a capacity corresponding to sampling points of discrete frequencies. A result of transform is also temporarily stored and output in the sequence of discrete frequencies. The inverse discrete Fourier transformers (IDFT-A) 3 and (IDFT-B) 8 also temporarily store the data at respective sampling times in their internal buffers and Fourier-transform them and output them in sequence of time. However, as mentioned previously, the later part of the data is interpreted as data at equivalently negative times.

Figure 2:
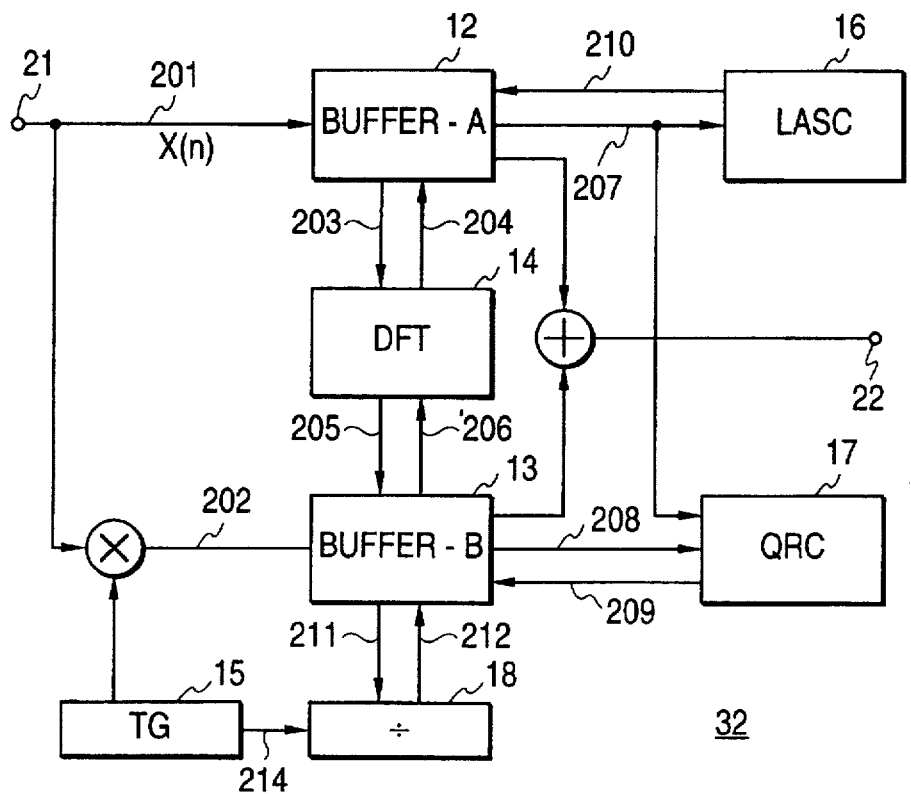
FIG. 2 is a block diagram of a second embodiment of the present invention.

FIG. 2 is a block diagram showing a second embodiment of the present invention whose principle of operation is the same as that of the first embodiment. The second embodiment is featured by that, in order to simplify the construction thereof, components of the first embodiment which have similar function are unified by using time division multiplexing. Further, the discrete Fourier transform is also commonly made by utilizing the fact that the inverse transformation can be done in a similar manner to the forward transform by changing coefficients of transformation. In addition, the time generation is also made common since the interpretation that the later half of the data in discrete Fourier transform is at negative time is also correct for a processing of a former half of the data.

In FIG. 2, components having the same functions as those shown in FIG. 1 are referred by the same names with same reference numerals.

A complex cepstral analyzer 32 for speech signals according to the second embodiment comprises an input terminal 21 for receiving samples of input speech data, a buffer A 12 connected to the input terminal 21, a multiplier 4 connected to the input terminal 21 for multiplying the samples of the speech data with values of respective times generated by a time generator (TG) 15, a buffer B 13 connected to the multiplier 4 and receiving an output of the multiplier 4, a discrete Fourier transformer 14 connected to the buffers A 12 and B 13 for temporarily performing a discrete forward or inverse Fourier transformation of the input data and turning a result back to one of the buffers A 12 and B 13 to which the data is input, a logarithmic amplitude spectrum calculator 16 for receiving, through the buffer A 12, a spectrum which is obtained from the discrete Fourier transformer 14 by performing a discrete Fourier transformation of respective samples of voice data multiplied With the window, calculating a logarithm of an absolute value of the voice spectrum and turning a result back to the buffer A 12 as a logarithmic amplitude spectrum, a quotient real part calculator 17 for turning a real part of a quotient obtained by dividing the differential spectrum input from the buffer B 13 by the voice spectrum input from the buffer A 12 back to the buffer B 13, a divider 18 for dividing values of the respective samples of time function corresponding to the result of inverse transformation turned back to the buffer B 13 and stored therein by values of respective times generated by the time generator 15 and turning a result back to the buffer B 13 as a time function corresponding to phase of the voice signal spectrum and an adder 11 for adding time values of the time function corresponding to the logarithmic amplitude spectrum, which is turned back to and stored in the buffer A 12, and the time function corresponding to the phase of the voice signal spectrum, which is stored in the buffer B 13, at respective times to obtain values of a complex cepstrum at the respective times and outputting a result to an output terminal 22 as a value of complex cepstrum at each time.

Now, an operation of the analyzer of the second embodiment will be described.

First, a speech data x(n) is inputted from the input terminal 21 through a signal line 201 to the buffer A 12 and the multiplier 4. The buffer A 12 stores the input voice data as it is temporarily. On the other hand, the voice data input to the multiplier 4 is multiplied with time values supplied thereto from the time generator (TG) 15 through a signal line 213 in synchronism with the data input and a result is sent through a signal line 102 to the buffer B 13 and stored temporarily therein.

Then, the buffer A 12 sends the speech data to the discrete Fourier transformer 14 through a signal line 203, in which the data is transformed forwardly. The voice spectrum data F{x(n)} thus transformed is returned to the buffer A 12 through a signal line 204 and stored therein. Then, the buffer B 13 sends the data multiplied with time, n·x(n), to the discrete Fourier transformer 14 through a signal line 206, in which it is transformed forwardly. The differential spectrum obtained by this transformation is returned to the buffer B 13 through a signal line 205 and stored therein.

Then, the buffer A 12 sends the voice spectrum data to the logarithmic amplitude spectrum calculator 16 and the quotient real part calculator 17 through a signal line 207. Simultaneously, the buffer B 13 sends the data of the differential spectrum to the quotient real part calculator 17 through a signal line 208. The logarithmic amplitude spectrum calculator 16 calculates a logarithm of the real part value of an absolute value of the received voice spectrum data log|F{x(n)}| and sends it back to the buffer A 12 through a signal line 210. On the other hand, the quotient real part calculator 17 calculates a read part Re[F{n·x(n)}/F{x(n)}] by dividing the differential spectrum data sent from the buffer B 13 by the voice spectrum data sent from the buffer A 12 and sends it back to the buffer B 13 through a signal line 209.

Then, the logarithmic amplitude spectrum is sent again from the buffer A 12 through the signal line 203 to the discrete Fourier transformer 14 and returned to the buffer A 12 through the signal line 204 after inverse transformed. Thereafter, the real part of the value obtained by dividing the differential spectrum by the original spectrum is sent from the buffer B 13 through the signal line 205 to the discrete Fourier transformer 14 and, after inverse transformed, sent back to the buffer B 13 through the signal line 206. This data is further sent to the divider 18 through a signal line 211 and divided therein by the equivalent time data sent from the time generator 5, and a result is returned to the buffer B 13 through a signal line 212.

In this stage, a component of complex cepstrum corresponding to the logarithmic amplitude spectrum is stored in the buffer A 12 and a component of complex cepstrum corresponding to phase is stored in the buffer B 13. Finally, the contents of the buffers A 12 and B 13 are sent to the adder 11 through signal lines 215 and 216, respectively, and added to each other, resulting in a complex cepstrum which is output to the output terminal 22 through a signal line 217.

Figure 3:
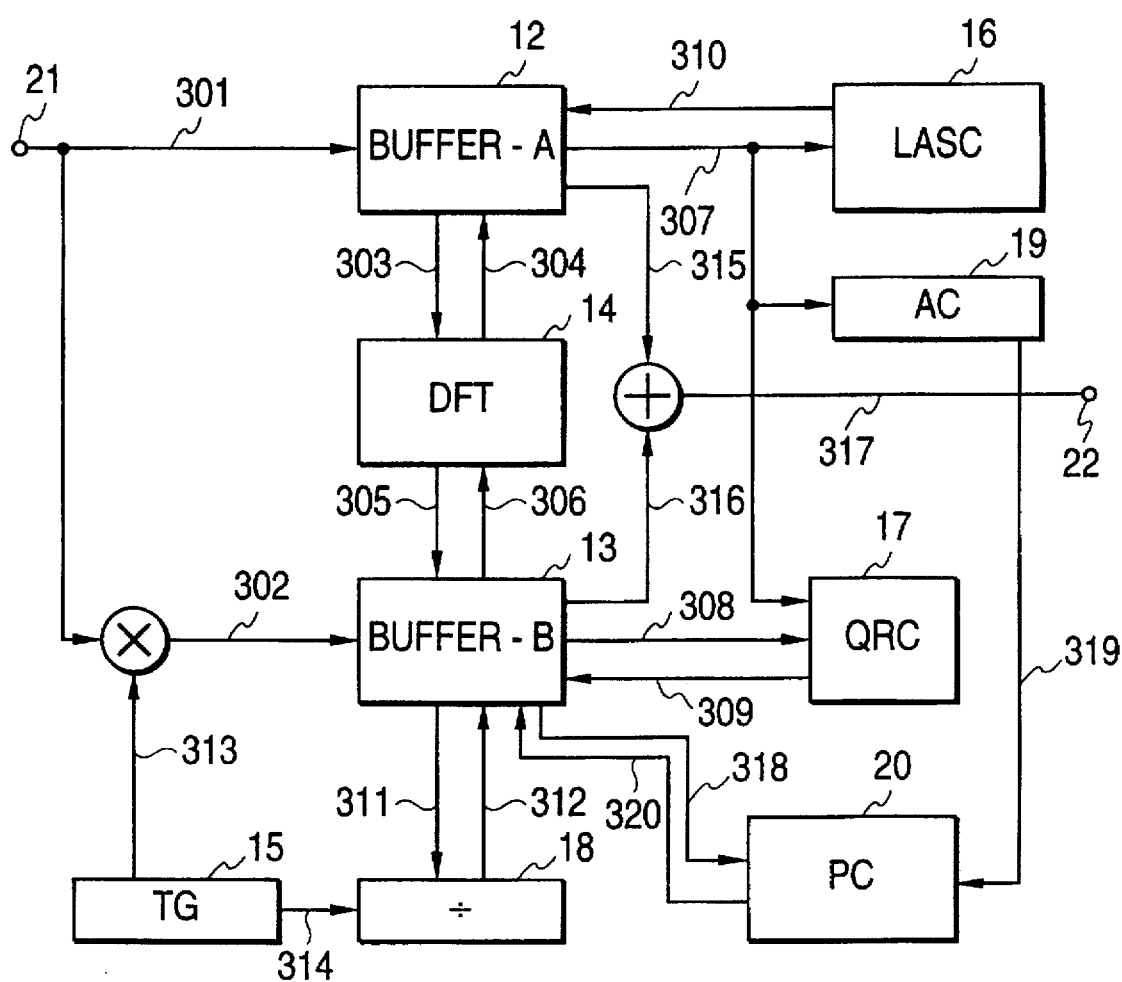
FIG. 3 is a block diagram of a third embodiment of the present invention.

FIG. 3 is a block diagram of a third embodiment of the present invention. The third embodiment is featured by that, in order to simplify the construction thereof, components of the first embodiment which have similar function are unified by using time division multiplexing as in the case of the second embodiment.

In FIG. 3, components having the same functions as those shown in FIGS. 1 and 2 are referred by the same names with same reference numerals.

A complex cepstral analyzer 33 for speech data according to the third embodiment comprises an input terminal 21 for receiving samples of speech data, a buffer A 12 connected to the input terminal 21, a multiplier 4 connected to the input terminal 21 for multiplying the samples of the speech data with values of respective times generated by a time generator (TG) 15, a buffer B 13 connected to the multiplier 4 and receiving an output of the multiplier 4, a discrete Fourier transformer (DFT) 14 connected to the buffers A 12 and B 13 for temporarily performing a discrete forward or inverse Fourier transformation of the input data and turning a result back to one of the buffers A 12 and B 13 to which the data is input, a logarithmic amplitude spectrum calculator 16 for receiving, through the buffer A 12, a voice signal spectrum which is obtained from the discrete Fourier transformer 14 by performing a discrete Fourier transformation of respective samples of speech data, calculating a logarithm of an absolute value of the voice spectrum and turning a result back to the buffer A 12 as a logarithmic amplitude spectrum, an argument calculator 19 for obtaining an argument by calculating arc tangent of a real part and an imaginary part of the voice spectrum input from the buffer A 12, a quotient real part calculator 17 for turning a real part of a quotient obtained by dividing the differential spectrum inputted from the buffer B 13 by the voice spectrum input from the buffer A 12 back to the buffer B 13, a divider 18 for turning the real part of the quotient input to the buffer B 13 back to the buffer B 13 after performing an inverse transformation therefor by the discrete Fourier transformer 14, dividing values of the respective samples of time function corresponding to the result of inverse transformation stored in the buffer B 13 by values of respective times generated by the time generator 15 and turning a result back to the buffer B 13 as a time function corresponding to phase of the speech signal spectrum, a phase compensator 20 for receiving the time function corresponding to phase of the voice spectrum from the buffer B 13, correcting the time function by a value of the argument calculated by the argument calculator 19 and outputting it to the buffer B 13 and an adder 11 for adding time values of the time function corresponding to the logarithmic amplitude spectrum, which is obtained by performing an inverse transformation for the logarithmic amplitude spectrum input from the buffer A 12, turned back to and stored in the buffer A 12, and the time function corresponding to the phase of the voice signal spectrum, which is phase-compensated and stored in the buffer B 13, at respective times to obtain values of a complex cepstrum at the respective times and outputting a result to an output terminal 22.

Now, an operation of the analyzer of the third embodiment will be described.

First, a speech data x(n) is inputted from the input terminal 21 through a signal line 301 to the buffer A 12 and the multiplier 4. The buffer A 12 stores the input voice data as it is temporarily. On the other hand, the speech data inputted to the multiplier 4 is multiplied with a time value n supplied thereto from the time generator (TG) 15 through a signal line 313 in synchronism with the speech data and a result n·x(n) is sent through a signal line 302 to the buffer B 13 and stored temporarily therein.

Then, the buffer A 12 sends the speech data to the discrete Fourier transformer 14 through a signal line 303, in which the data is transformed forwardly. The spectrum data F{x(n)} thus transformed is returned to the buffer A 12 through a signal line 304 and stored therein. Then, the buffer B 13 sends the data multiplied with time, that is, n·x(n), to the discrete Fourier transformer 14 through a signal line 306, in which it is transformed forwardly. The differential spectrum F{n·x(n)} obtained by this transformation is returned to the buffer B 13 through a signal line 305 and stored therein.

Then, the buffer A 12 sends the voice spectrum data F{x(n)} to the quotient real part calculator 17 through a signal line 307. Simultaneously, the buffer B 13 sends the data of the differential spectrum to the quotient real part calculator (QRC) 17 through a signal line 308. The quotient real part calculator (QRC) 17 calculates a real part Re[F{n·x(n)}/F{x(n)}] of a value obtained by dividing the differential spectrum data sent from the buffer B 13 by the voice spectrum data sent from the buffer A 12 and sends it back to the buffer B 13 through a signal line 309.

In the second embodiment, the spectrum data is sent from the buffer A 12 to the logarithmic amplitude spectrum calculator 16 and the quotient real part calculator 17 simultaneously through the signal line 207 and then the logarithmic amplitude spectrum is calculated. In the third embodiment, however, the spectrum data stored in the buffer A 12 at this timing is saved and the logarithmic amplitude spectrum is calculated after an exact value of phase is obtained. Therefore, the data transfer to the logarithmic amplitude spectrum calculator 16 is not performed in the third embodiment, so that there is no need of providing another buffer for saving the voice spectrum data.

Thereafter, the real part of the value obtained by dividing the differential spectrum by the spectrum is sent from the buffer B 13 to the discrete Fourier transformer 14 through the signal line 305 and inverse-transformed therein, and a result, FI[Re[F{n·x(n)}/F{x(n)}]], is turned back to the buffer B 13 through the signal line 306. This data is further sent to the divider 18 through a signal line 311 and divided therein by the equivalent time data sent from the time generator 15, and a result, b(n), is returned to the buffer B 13 through a signal line 312. Thereafter, the data is sent from the buffer B 13 through the signal line 305 to the discrete Fourier transformer 14 and, after transformed inversely, returned to the buffer B 13 through the signal line 306. This data corresponds to a first order approximation of phase.

Then, the voice spectrum data is sent from the buffer A 12 through the signal line 307 to the argument calculator (AC) 19 in which a value of argument is calculated from the real and imaginary parts thereof and the argument thus calculated is sent to the phase compensator (PC) 20 through a signal line 319. On the other hand, the phase value of the first order approximation is sent from the buffer B 13 through a signal line 318 to the phase compensator 20 in which phase compensation is performed on the basis of the argument and a more precise phase value is turned back to the buffer B 13 through a signal line 320.

This phase data is sent from the buffer B 13 through the signal line 305 to the discrete Fourier transformer 14 in which it is inverse-transformed, resulting in a component of the complex cepstrum corresponding to phase, which is turned back to the buffer B 13 through a signal line 316.

On the other hand, the voice spectrum data is sent from the buffer A 12 through the signal line 307 to the logarithmic amplitude spectrum calculator 16 in which a logarithm of a real part of an absolute value of the voice spectrum data, which is turned back to the buffer A 12 through a signal line 310. Then, the logarithmic amplitude spectrum log |F{x(n)}| is sent from the buffer A 12 through the signal line 303 to the discrete Fourier transformer 14 in which it is inverse-transformed and a result thereof is turned back to the buffer A 12 through the signal line 304. This data is a component of the cepstrum corresponding to logarithmic amplitude spectrum.

In this stage, the component of the complex cepstrum corresponding to the logarithmic amplitude spectrum is stored in the buffer A 12 and the component of the complex cepstrum corresponding to the corrected phase is stored in the buffer B 13. Finally, the data stored in the buffers A 12 and B 13 are sent to the adder 11 through the signal lines 315 and 316, respectively, and added to each other, resulting in the complex cepstrum which is output to the output terminal 22 through a signal line 217.

As described hereinbefore, according to the present invention, a time function corresponding to phase is obtained by obtaining a spectrum of an input speech signal by means of a discrete Fourier transformer, simultaneously, obtaining a differential spectrum by multiplying the input voice signal spectrum with times of respective samples in a multiplier, obtaining a real part of a value obtained by dividing the differential spectrum by the voice signal spectrum by means of a quotient real part calculator, inverse-transforming the real part by a discrete Fourier transformer and dividing the values of the respective samples by the values of the time by means of a divider. On the other hand, a time function corresponding a logarithmic amplitude spectrum is obtained by means of a logarithmic amplitude spectrum calculator and a discrete Fourier transformer. Finally, a complex cepstrum is obtained by adding the both time functions at respective times by an adder. Therefore, when data which is obtained by digitizing a voice signal is to be analyzed, the complex cepstrum which is a parameter representing a logarithmic amplitude spectrum and a phase characteristics of a voice signal can be extracted with high precision and with relatively small amount of operation and without error.

What is claimed is:

1. A complex cepstrum analyzer for a speech signal, for analyzing the speech signal and extracting a complex cepstrum, comprising:

a first discrete Fourier transformer for performing a discrete Fourier transformation of samples x(n) of an input speech signal and outputting a spectrum of the input speech signal as a voice spectrum, wherein n denotes a variable indicative of a sample time of each of the samples;

a multiplier for multiplying the samples of the speech signal with values of the sample time n corresponding to each of the samples;

a second discrete Fourier transformer for performing a discrete Fourier transformation for an output of said multiplier and outputting a result as a differential spectrum, the result being a differentiation of said voice spectrum multiplied with a unit imaginary number;

a logarithmic amplitude spectrum calculator for calculating a logarithm of an absolute value of the voice spectrum output from said first discrete Fourier transformer and outputting a result as a logarithmic amplitude spectrum;

a first discrete inverse Fourier transformer for performing a discrete inverse Fourier transformation for the logarithmic amplitude spectrum outputted from said logarithmic amplitude spectrum calculator and outputting a result as a time function corresponding to the logarithmic amplitude spectrum;

a quotient real part calculator for outputting a real part of a quotient obtained by dividing the differential spectrum output from said second discrete Fourier transformer by the voice spectrum output from said first discrete Fourier transformer;

a second discrete inverse Fourier transformer for performing a discrete inverse Fourier transformation for the real part of the quotient output from said quotient real part calculator and outputting a result as a time function value corresponding to the real part of the quotient;

a divider for dividing a value of each sample of the time function corresponding to the real part of the quotient by a value of each time and outputting a result as a time function value corresponding to phase of the spectrum; and an adder for adding time values of the time function corresponding to phase of the voice spectrum output from said divider and values of the time function corresponding to the logarithmic amplitude spectrum for each sample time n and outputting a result as values of said complex cepstrum for each sample time n.

2. A complex cepstrum analyzer for voice signals, for analyzing an input speech signal and extracting a complex spectrum, comprising:

a first buffer connected to an input terminal for receiving samples x(n) of an input speech signal, wherein n denotes a variable indicative of a sample time of each of the samples;

a multiplier connected to said input terminal, for multiplying the samples x(n) of the input speech signal with values of the sample time n corresponding to each of the samples;

a second buffer connected to said multiplier and receiving an output of said multiplier;

a discrete Fourier transformer connected to said first and second buffers for performing a discrete forward or inverse Fourier transformation of an output received from first buffer and an output received from said second buffer and sending a result back to one of said first and second buffers to which the output was received, said first buffer being adapted to store a spectrum obtained from said discrete Fourier transformer by said discrete Fourier transformer performing a discrete Fourier transformation for the samples of the input speech signal data stored in said first buffer, and said second buffer being adapted to store a differential spectrum obtained from said discrete Fourier transformer by said discrete Fourier transformer performing a discrete Fourier transformation for the samples of the data output from said multiplier and stored in said second buffer;

a quotient real part calculator for sending a real part of a quotient obtained by dividing the differential spectrum output from said second buffer by the spectrum output from said first buffer back to said second buffer;

a divider for dividing a value of each sample of a time function corresponding to the result of an inverse Fourier transformation performed by said discrete Fourier transformer and sent back to said second buffer and stored in said second buffer by reference to the sample time n, and sending a result back to said second buffer as a time function corresponding to a phase of the spectrum;

a logarithmic amplitude spectrum calculator for calculating a logarithm of an absolute value of the spectrum stored in said first buffer and sending a result back to said first buffer as a logarithmic amplitude spectrum, the logarithmic amplitude spectrum being then sent from said first buffer to said discrete Fourier transformer to be subject to an inverse Fourier transformation by said discrete Fourier transformer to obtain a time function of the logarithmic amplitude spectrum which is stored in said first buffer; and an adder for adding time values of the time function corresponding to the logarithmic amplitude spectrum stored in said first buffer and the time function corresponding to the phase of the spectrum stored in said second buffer at each sample time n, to obtain values of a complex cepstrum at each sample time n and outputting the values of the complex cepstrum at each sample time n.

3. A complex cepstrum analyzer for a speech signal, for analyzing the speech signal and extracting a complex cepstrum, comprising:

a first buffer connected to an input terminal for receiving an input speech signal;

a multiplier connected to said input terminal, for multiplying samples x(n) of the input speech signal with values n representing sampling times of the samples;

a second buffer connected to said multiplier for temporarily storing an output of said multiplier;

a discrete Fourier transformer connected to said first and second buffers for performing a discrete forward or inverse Fourier transformation of an output received from first buffer and an output received from said second buffer and sending a result back to one of said first and second buffers to which the output was received, said first buffer being adapted to store a spectrum obtained from said discrete Fourier transformer by said discrete Fourier transformer performing a discrete Fourier transformation for the samples of the input speech signal data stored in said first buffer, and said second buffer being adapted to store a differential spectrum obtained from said discrete Fourier transformer by said discrete Fourier transformer performing a discrete Fourier transformation for the samples of the data output from said multiplier and stored in said second buffer;

a quotient real part calculator for sending a real part of a quotient obtained by dividing the differential spectrum output from said second buffer by the spectrum output from said first buffer back to said second buffer;

a divider for dividing a result of inverse transformation obtained by an inverse transformation of the real part of the quotient stored in said second buffer by means of said discrete Fourier transformer, sent back to said second buffer and stored in said second buffer by the time values n corresponding to the time samples of the time function, and sending a result back to said second buffer as a time function corresponding to a phase of the voice signal spectrum;

an argument calculator for obtaining, after said discrete Fourier transformer receives the time function corresponding to the phase of the voice spectrum from said second buffer and performs a discrete Fourier transformation for the time function to obtain the phase of the spectrum and sends the phase of the spectrum back to said second buffer, an argument by calculating arc tangent of a real part and an imaginary part of the spectrum supplied from said first buffer;

a phase corrector for receiving the phase of the spectrum stored in said second buffer, correcting the phase of the spectrum with a value of argument calculated by said argument calculator, and outputting the corrected phase to said second buffer;

a logarithmic amplitude spectrum calculator for calculating, after said discrete Fourier transformer performs a discrete Fourier transformation for the corrected phase of the spectrum stored in said second buffer to obtain the time function corresponding to the corrected phase of the spectrum and sends the time function corresponding to the corrected phase back to said second buffer, a logarithm of an absolute value of the spectrum stored in said first buffer and sending a result back to said first buffer as a logarithmic amplitude spectrum, the logarithmic amplitude spectrum being then sent from said first buffer to said discrete Fourier transformer to be subject to an inverse Fourier transformation by said discrete Fourier transformer to obtain a time function of the logarithmic amplitude spectrum which is stored in said first buffer; and an adder for adding time values of the time function corresponding to the logarithmic amplitude spectrum obtained by said discrete Fourier transformer performing the inverse transformation for the logarithmic amplitude spectrum stored in said first buffer by means of said discrete Fourier transformer and sent back to and stored in said first buffer and the time function corresponding to the phase of the voice signal spectrum corrected and stored in said second buffer at each sample time n, to obtain values of a complex cepstrum at each sample time n and outputting a result to an output terminal.

* * * * *